(12) United States Patent
Lee et al.

(10) Patent No.: US 6,573,786 B2
(45) Date of Patent: Jun. 3, 2003

(54) ELECTRONIC DEVICES COMPRISING AN AUDIO AMPLIFIER AND METHODS FOR CONTROLLING SUCH ELECTRONIC DEVICES

(75) Inventors: Kok Joo Lee, Singapore (SG); Hong Wei Pang, Singapore (SG)

(73) Assignee: Thomson Licensing, S.A., Boulogne-Billancourt (FR)

( * ) Notice: Subject to any disclaimer, the term of this patent is extended or adjusted under 35 U.S.C. 154(b) by 63 days.

(21) Appl. No.: 09/837,393

(22) Filed: Apr. 18, 2001

(65) Prior Publication Data

US 2001/0033198 A1 Oct. 25, 2001

(30) Foreign Application Priority Data

Apr. 19, 2000 (EP) .............................................. 00401098

(51) Int. Cl.[7] .................................................. H03F 1/14
(52) U.S. Cl. ......................... 330/51; 330/280; 330/281; 348/632; 381/94.5
(58) Field of Search ........................... 330/51, 280, 281; 348/632; 381/94.5, 94

(56) References Cited

U.S. PATENT DOCUMENTS

| | | | | |
|---|---|---|---|---|
| 5,029,005 A | * | 7/1991 | Morris, Jr. .................... | 330/51 |
| 5,103,315 A | * | 4/1992 | Kufta et al. .................. | 348/632 |
| 5,208,865 A | * | 5/1993 | Friske et al. ................. | 381/107 |
| 5,734,729 A | * | 3/1998 | Tran ............................ | 381/120 |
| 5,768,601 A | * | 6/1998 | Tran ............................ | 330/297 |

FOREIGN PATENT DOCUMENTS

| | | | | |
|---|---|---|---|---|
| EP | 0 785 501 A2 | 7/1997 | ............. | G06F/3/16 |
| EP | 0 785 501 A3 | 7/1997 | ............. | G06F/3/16 |
| EP | 0862265 | 9/1998 | | |

* cited by examiner

Primary Examiner—Michael Tokar
Assistant Examiner—Khai M. Nguyen
(74) Attorney, Agent, or Firm—Joseph S. Tripoli; Joseph J. Laks; Reitseng Lin

(57) ABSTRACT

An electronic device comprises an audio amplifier, a main microprocessor and a user interface microprocessor. The UI microprocessor has a control pin for muting the audio amplifier. A muting circuit is provided for muting the audio amplifier when a signal representative of a switch to an OFF mode of the device is generated by a mode pin of the main microprocessor. A delay part is also provided in order to switch the audio amplifier to standby during a given period of time when a signal representative of a switch to an ON mode of the device is generated by the mode pin.

Methods for controlling the electronic device are also proposed.

10 Claims, 3 Drawing Sheets

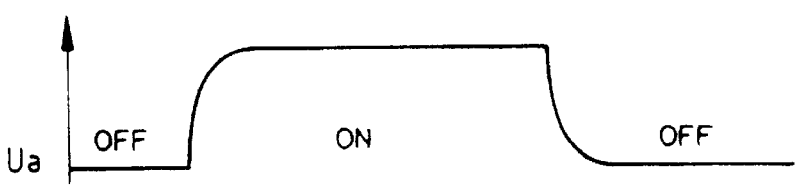
FIG.3a  Ua
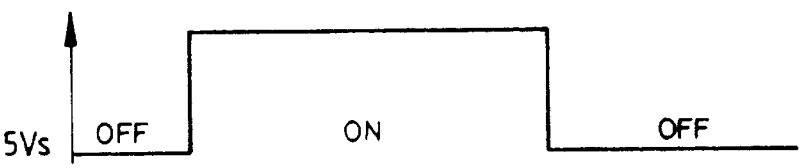
FIG.3b  SVs
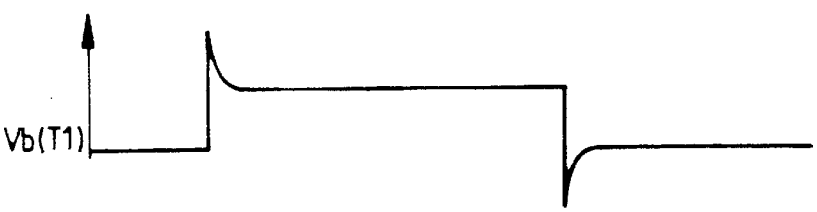
FIG.3c  Vb(T1)
FIG.3d  VC(T1)
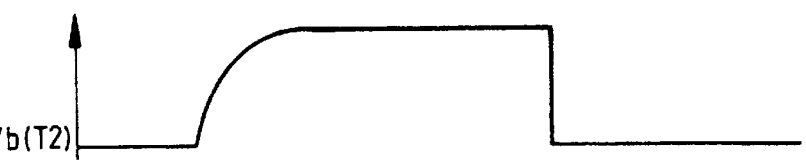
FIG.3e  Vb(T2)
FIG.3f  VC(T2)
FIG.3g  $V_{32}$
FIG.3h  $V_{16}$

ELECTRONIC DEVICES COMPRISING AN AUDIO AMPLIFIER AND METHODS FOR CONTROLLING SUCH ELECTRONIC DEVICES

FIELD OF THE INVENTION

The invention relates to electronic devices comprising an audio amplifier and to methods for controlling such electronic devices.

BACKGROUND OF THE INVENTION

Such electronic devices are widely used nowadays. The signal generated by the amplifier is sent directly or through another amplifier to loudspeakers for the reproduction of sound.

A problem may occur when the working mode of the device changes because the energy supplied to the amplifier may vary in a uncontrolled way and the generated signal may consequently be disturbed. This would give rise to what is known as a pop sound in the loudspeakers.

Various solutions have been proposed to reduce the disturbances.

It was for instance disclosed in patent application EP 0 785 501 to use a TTL POWERGOOD signal generated by a dedicated power failure detector of a power supply described in U.S. Pat. No. 5,224,010: a delayed version of POWERGOOD is utilised to mute the audio amplifier during the power-up and POWERGOOD is used to mute the audio amplifier during the power down.

However, such a power failure detector is a costly element and cheap power supplies are not provided with any.

Another solution which has been used is described as prior art in patent application EP 0 862 265: a microprocessor mutes the audio amplifier through a specific pin during interrupt routines which are triggered upon detection of a decreasing supply voltage. As explained in the patent application, this method is too slow, as the muting action is only generated after the decrease in voltage which creates the disturbance.

EP 0 862 286 proposes another solution using a fly-back transformer. This solution cannot therefore be implemented in electronic devices where such a fly-back transformer is not provided. Moreover, the proposed solution still uses a Zener diode, which is an expensive component.

SUMMARY OF THE INVENTION

The present invention seeks a solution to reduce the cost of the electronic device while at the same time reducing further the disturbances generated by the audio amplifier.

The invention proposes an electronic device comprising
an audio amplifier with a mute pin;
a first micro-processor connected to the mute pin
a second micro-processor having a mode pin;
a muting circuit with an input connected to the mode pin and with an output connected to the mute pin.
Further possible features are the following
a delay part of the muting circuit has an input connected to the mode pin and an output connected to a standby pin of the audio amplifier;
the delay part comprises a RC network interposed between the mode pin and the standby pin;
the RC network is connected to the base of a transistor whose collector is connected to the standby pin through a resistor;
a capacitor is interposed between the mode pin and the base of a transistor;
the collector of said transistor is connected to the mute pin via a diode and a resitor in series
the output of the muting circuit and a control pin of the first microprocessor are input to an OR circuit connected to the mute pin.

The invention further proposes a method for controlling the electronic device, comprising the succesive steps of:
generating a signal representative of an ON operating mode of the device on the mode pin;
generating a signal representative of an OFF operating mode of the device on the mode pin;
transmitting the signal representative of an OFF operating mode of the device to the mute pin through the muting circuit;
muting the audio amplifier.

Another feature of this method is possibly that the electronic device further includes a power supply with at least a DC output and that the period of time for transmitting the signal representative of an OFF operating mode of the device to the mute pin through the muting circuit is shorter than time constant of the DC output.

The invention also proposes a method for controlling the electronic device, comprising the successive steps of:
generating a signal representative of an OFF operating mode of the device on the mode pin;
generating a signal representative of an ON operating mode of the device on the mode pin;
switching the audio amplifier to standby mode when the signal representative of the ON mode is received on the standby pin;
waiting for a given period of time;
switching the audio amplifier to normal mode.

BRIEF DESCRIPTION OF THE DRAWINGS

The invention and other features thereof will be better understood in the light of the following description made with reference to the attached drawings where:

FIGS. 3a to 3h are diagrams representing the voltage at various points of the schematics of FIG. 2 for different operating modes.

DETAILED DESCRIPTION OF PREFERED EMBODIMENTS

Figure 1:
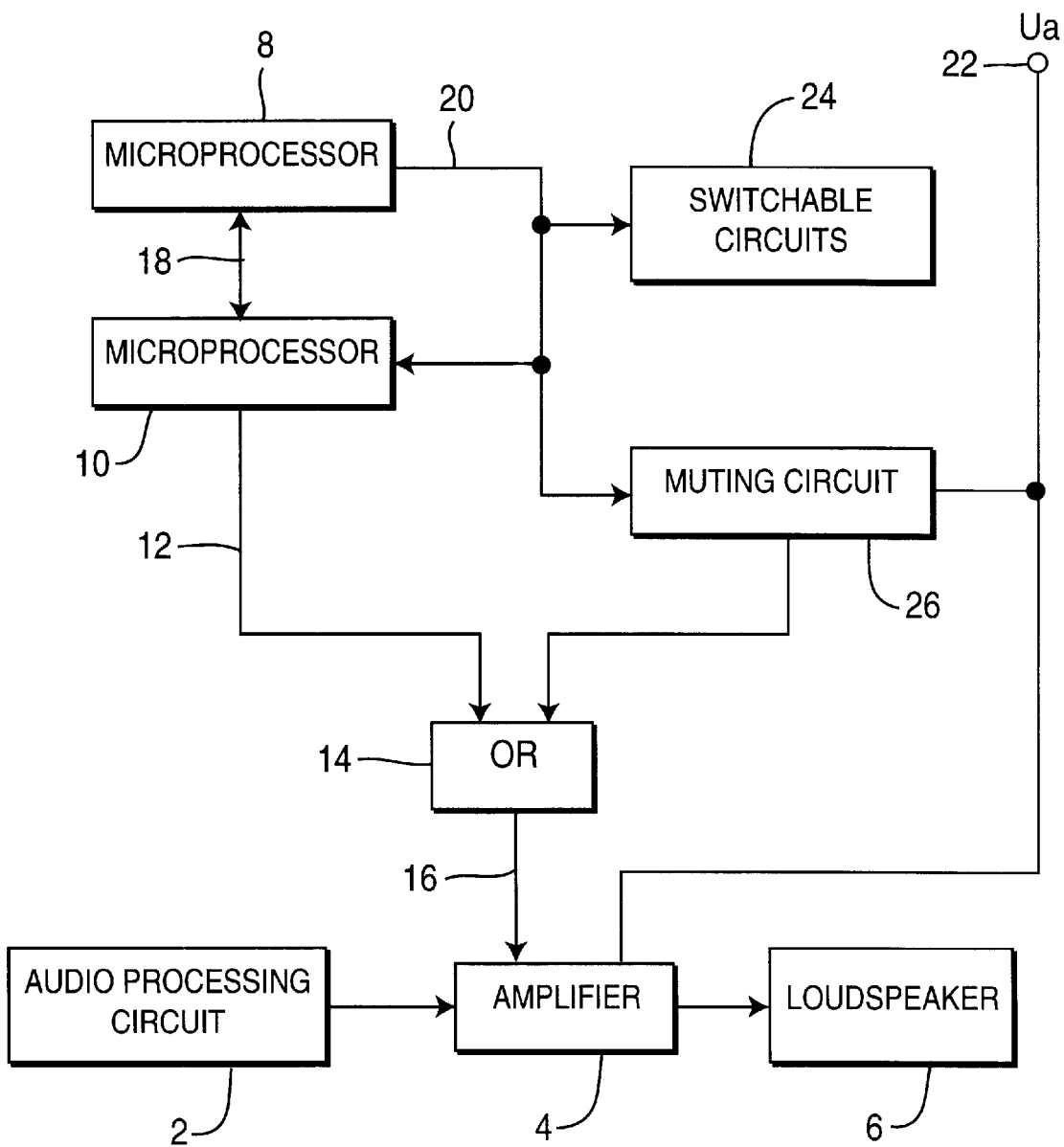
FIG. 1 represents schematically the main elements of the electronic device of the invention

In the embodiment described below, the invention is implemented on a TV set. For sound reproduction, the TV set mainly includes an audio processing circuit 2, an audio amplifier 4 and a loudspeaker 6. The audio processing circuit 2 extracts an audio signal from a composite video signal (CVBS) received for instance from a front-end (tuner and demodulator) or from a video player (VCR or DVD-player for instance).

The audio signal generated by the audio processing circuit 2 is amplified by the audio amplifier 4 and then sent to the loudspeaker 6 which generates corresponding sounds.

The TV set has a power supply (not represented) generated on its outputs various direct current (DC) voltages. It can for instance be a switched-mode power supply (SMPS)

as widely used in TV sets. On its Ua output 22, the power supply generates 22 V when the TV set is ON. The amplifier 4 is electrically fed by the Ua output.

The TV set includes a main microprocessor 8 and a specific user interface (UI) microprocessor 10. Generally speaking, a specific microprocessor 10 is dedicated to some electronic circuits of the TV set, here user interface (UI) circuits, amongst which the audio amplifier 4. The UI microprocessor 10 has a control pin 12 connected to a mute pin 16 of the amplifier 4 via a OR circuit 14. When the UI microprocessor 10 generates a mute signal on its control pin 12, the amplifier 4 receives the mute signal on its mute pin 16 and as a consequence stops sending any signal to the loudspeaker 6.

The main processor 8 and the UI processor 10 are linked via a bidirectional link 18, for instance an 12C port. The main mircoprocessor 8 has a mode pin 20 generating a mode signal representative of the operating mode of the TV set. For instance, mode pin 20 is at a high level of voltage (5 V) when the TV set is on (which means every electronic circuit is fed by the power supply and able to operate) and at low level (0 V) when the set is off or in standby (which means at least part of the electronic circuits is not fed by the power supply or not operating).

The mode signal is received by switchable circuits (which status is dependent upon the operating mode), amongst which specific switchable circuits 24 (for instance a tuner or a video processing circuit), the UI microprocessor 10 and a muting circuit 26 which will be described below with further details.

The muting circuit 26 is also electrically fed from the Ua output 22 of the power supply. The muting circuit 26 is connected to the mute pin 16 of the amplifier 4 via the OR circuit 14. A muting signal from the muting circuit 26 thus also mutes the loudspeaker 6.

Figure 2:
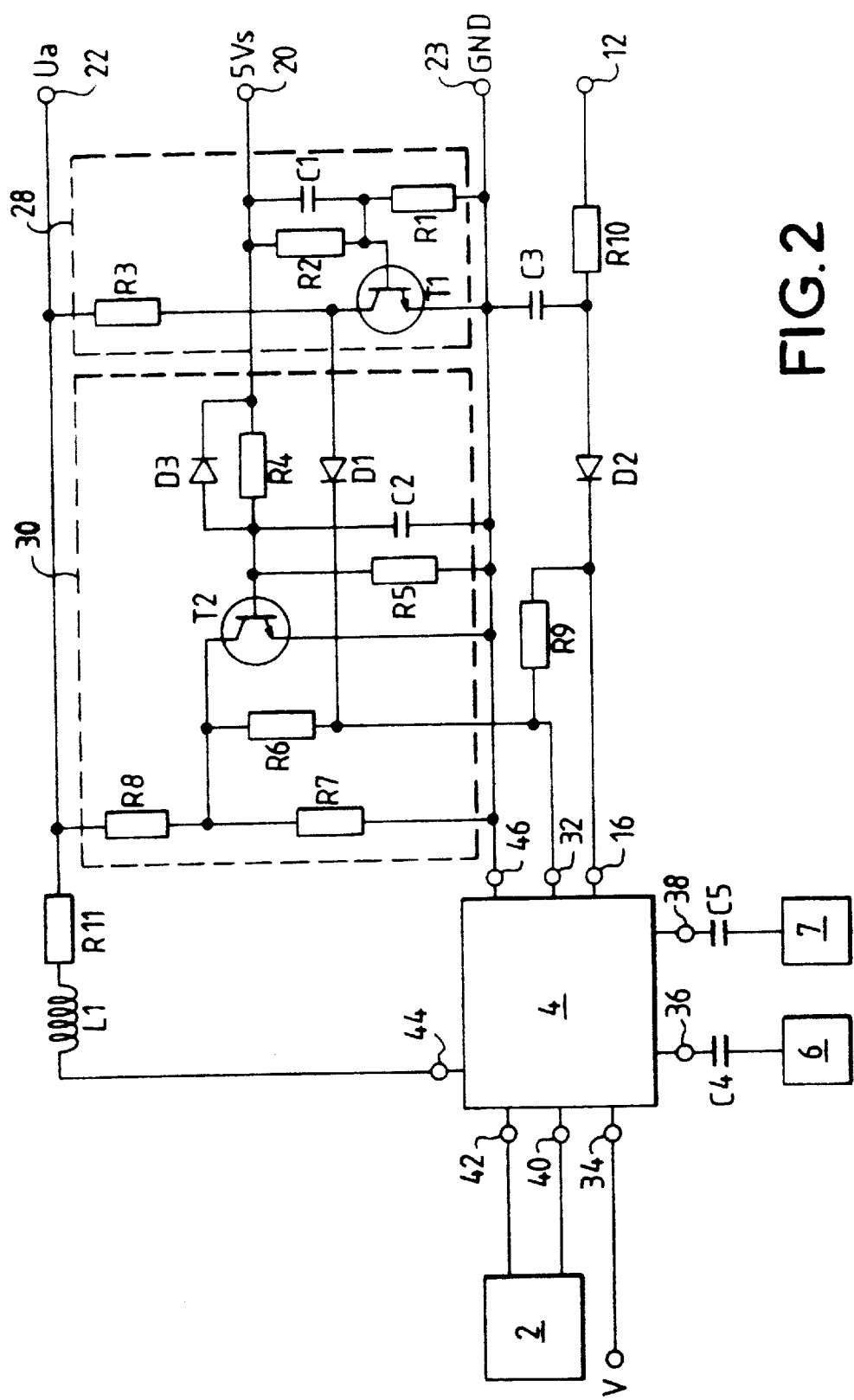
FIG. 2 is schematics of a detailed implementation of the invention

FIG. 2 represents a detailed implementation of the circuit of FIG. 1. The audio amplifier 4 is an integrated circuit (IC) with a plurality of pins.

Two input pins 40, 42 are connected to the signal processing circuit for respectively receiving audio signals to be amplified and transmitted via output pins 36, 38 to a first loudspeaker 6 and a second loudspeaker 7 (only one loudspeaker 6 was represented on FIG. 1 for clarity). Capacitors C4 and C5 are interposed between the respective output pins 36, 38 and loudspeakers 6,7 to filter out DC voltages.

A volume pin 34 and the mute pin 16 are connected to the UI microprocessor 10. The volume pin 34 carries signals representative of the volume of reproduction selected by the user. These signals are sent by the UI microprocessor 10 (from point V), for instance depending on information stored in a memory linked to the UI microprocessor 10 and which can be modified by the user, for instance through an on-screen display (OSD) menu.

The mute pin 16 is connected to the control pin 12 of the UI microprocessor 10 through a resistor R10 and a diode D2 in series. As for the volume control, the UI microprocessor 10 can send a mute instruction (high level) to the amplifier 4, further to a corresponding command from the user. It can be noted that a capacitor C3 is connected between a grounded point 23 and the end of resistor R10 opposite the control pin 12. This capacitor 03 is meant to avoid sharp voltage transients at mute pin 16 in order to get rid of "click" sounds when muting is activated/deactivated by the UI microprocessor 10.

The amplifier 4 is fed from Ua output on a power pin 44 with interposition of an inductance L1 in series with a resistor R11 (which represents the resistance of the wire).

The muting circuit 26 includes a first part 28 which is designed for transitions from ON to OFF and which will now be described.

A transistor T1 has its emitter connected to ground 23 and its collector connected to Ua output 22 via a resistor R3. Its base is connected on the one hand to the mode pin 20 via a resistor R2 and a capacitor C1 in parallel, and on the other hand to ground 23 via a resistor R1.

The collector of transistor T1 is connected to a standby pin 32 of the amplifier 4 via a diode D1. The standby pin 32 is in turn connected to the mute pin 16 through a resistor R9.

The muting circuit 26 also includes a second part 30 which is designed for OFF to ON transitions and which will now be described.

A transistor T2 has its emitter connected to ground 23 and its collector connected a voltage divider; more precisely, the emitter of transistor T2 is connected via a resistor R8 to Ua output 22 and via a resistor R7 to ground 23. The collector of transistor T2 is connected to the standby pin 32 through a resistor R6.

The base of transistor T2 is linked to the mode pin 20 via a resistor R4 and a diode D3 in parallel and to ground 23 via a resistor R5 and capacitor C2 in parallel.

The way the muting circuit 26 operates will now be described in view of FIGS. 3a to 3h.

The voltage at Ua output 22 is represented at FIG. 3a. When the TV set is off, the voltage of Ua output 22 is of course 0 V. When the TV set is switched on, the voltage of Ua output 22 rises relatively slowly to its nominal value of 22 V due to the necessary regulation of the power supply to generate DC voltages. All the same, when switching off the TV set, the fall in voltage at Ua output 22 is relatively slow. These phenomena occur with a given time constant, for instance about 4 s.

At the opposite, the voltage at the mode pin 20 (5 VS) strictly corresponds to the ON and OFF mode as explained above and represented at FIG. 3b, with sharp transient, as the mode pin 20 is meant to transmit information regarding the operating mode of the TV set to other circuitry (like the specific switchable circuit 24) when receiving an instruction from the user.

The voltages at the base and at the collector of transistor T1 are represented respectively at FIGS. 3c and 3d.

When in the ON mode, the voltage at the base of T1 is imposed by the voltage divider R1, R2 which resistance values are set so that the transistor T1 is on; the capacitor C1 is charged. As the transistor T1 is on, the voltage at the emitter of T1 is low and the diode D1 is blocked. Consequently, the first part 28 of the muting circuit 26 has no influence on the amplifier pins during the On mode.

When the voltage at mode pin 20 falls to 0 V, the capacitor C1 is still charged which immediately generates a corresponding negative voltage at the base of T1. The transistor T1 is therefore very quickly switched off which generates a high voltage of about 5 V at the collector of T1, thus opening diode D1 and pulling standby pin 32 and mute pin 16 (which voltages are represented respectively at FIG. 3g and 3h) to high level. The amplifier 4 is hence muted.

It is important to note that thanks to capacitor C1 the muting is very fast (less than 10 ms) and the spurious noises generated by the slower fall of Ua have no time to occur. The first part 28 of the muting circuit 26 acts as a fast inverter.

When the voltage at mute pin 16 is set at a high level by the muting circuit 26 as described above, the diode D2 is blocked and capacitor C3 has thus no effect of slowing the rise of the voltage at mute pin 16. This is on purpose, as the goal during ON to OFF transition is not to avoid click sounds but to get rid of the much louder pop sound.

Afterwards, the voltage at Ua output 22 falls (slowly relative to the blocking of T1), which cause the voltage in every part of the muting circuit 26 and at pins 16, 32 to fall too. But during this fall in voltage, the amplifier 4 is muted which avoids pop noises.

To sum up, the goal of the first part 28 of the muting circuit 26 is too mute the amplifier 4 very quickly when the TV set is switched off.

The operation of the second part 30 of the muting circuit 26 is described below. The voltages at the base and at the collector of transistor T2 are represented respectively on FIGS. 3e and 3f.

When the TV set is switched on, the voltage of the mode pin 20 goes up very quickly. As a consequence, the diode D3 is blocked and the resistors R4 and R5 together with the capacitor C2 (realising a RC network) generate a slow rise (time constant of 8 s) of the voltage at the base of T2 from 0 V, where the transistor T2 is switched off, until the voltage rises to 0.6 V, when the transistor T2 is then activated.

After the rising edge on the mode pin 20 is received, there will thus be a period of time (about 4 s) during which the transistor is still blocked.

The collector of transistor T2 will thus be at a high level (determined by the voltage divider R7, R8 and following the voltage of Ua output) during this period of time, as depicted on FIG. 3f.

The voltage at the standby pin 32 is then also at a high level, thereby transmitting a standby instruction to the amplifier 4. The voltage at the mute pin 16 is then also at a high level.

After said period of time, the transistor T2 is on (as capacitor C2 as has charged and the voltage at its base results from R4 and R5); the voltage at the collector of transistor T2 thus falls and standby pin 32 falls as well. The audio amplifier 4 is no more in standby.

To sum up, the second part 30 of the muting circuit allows to delay the switch from standby mode of the amplifier 4 to normal mode of the amplifier 4 when the TV set is powered. (For this reason the second part 30 is named delay part.) It is thereby sure that every other circuit in the apparatus operates normally before the audio amplifier 4 works, for instance to be sure that initialisation routines has taken place in the UI microprocessor 10, which routines could be delayed with respect to the main microcontroller 8 mode signal on mode pin 20.

When the TV set is switched off, diode D3 discharges C2 rapidly, so that the desired standby delay circuit will not be shortened during the next power up that follows shortly.

The following values are used in the above embodiment:
R1=7.5 kΩ,
R2=33 kΩ,
C1=0.47 μF,
R3=22 kΩ,
C3=1 μF,
R10=1 kΩ,
R4=27 kΩ,
C2=470 μF,
R5=10 kΩ,
R9=15 kΩ,
C4=470 μF,
C5=470 μF,
L1=33 μH,
R8=22 kΩ,
R7=6.8 kΩ.

The invention is not limited to the above described embodiment. Microprocessor should be understood with a wide meaning, including microcontrollers and similar circuits able to control other circuits.

What is claimed is:

1. An electronic device comprising:
   an audio amplifier with a mute pin;
   a first micro-processor connected to the mute pin and sending a mute signal through the mute pin;
   a second micro-processor having a mode pin; and
   a muting circuit with an input connected to the mode pin and with an output connected to the mute in.

2. An electronic device according to claim 1, wherein a delay part of the muting circuit has an input connected to the mode pin and an output connected to a standby pin of the audio amplifier.

3. An electronic device according to claim 2, wherein the delay part comprises a RC network interposed between the mode pin and the standby pin.

4. An electronic device according to claim 3, wherein the RC network is connected to the base of a transistor whose collector is connected to the standby pin through a resistor.

5. An electronic device according to claim 1, wherein a capacitor is interposed between the mode pin and the base of a transistor.

6. An electronic device according to claim 5, wherein the collector of said transistor is connected to the mute pin via a diode and a resistor in series.

7. An electronic device according to claim 1, wherein the output of the muting circuit and a control pin of the first micro-processor are input to an OR circuit connected to the mute pin.

8. A method for controlling an electronic device with a first micro-processor connected to a mute pin of an audio amplifier, comprising the successive steps of:
   generating a signal representative of an ON operating mode of the device on a mode pin of a second microprocessor;
   generating a signal representative of an OFF operating mode of the device on the mode pin;
   transmitting the signal representative of an OFF operating mode of the device to the mute pin through a muting circuit.

9. A method according to claim 8, wherein the electronic device further includes a power supply with at least a DC output and wherein the period of time for transmitting the signal representative of an OFF operating mode of the device to the mute pin through the muting circuit is shorter than time constant of the DC output.

10. A method for controlling an electronic device with a first micro-processor connected to a mute pin of an audio amplifier, comprising the successive steps of:
    generating a signal representative of an OFF operating mode of the device on a mode pin of a second microprocessor;
    generating a signal representative of an ON operating mode of the device on the mode pin;
    switching the audio amplifier to standby mode when the signal representative of the ON mode is received on a standby pin of the audio amplifier;
    waiting for a given period of time;
    switching the audio amplifier to normal mode.

* * * * *